US009326335B1

(12) United States Patent
Milanesi et al.

(10) Patent No.: US 9,326,335 B1
(45) Date of Patent: Apr. 26, 2016

(54) SECOND STAGE CALIBRATION IN DC/DC LED CURRENT REGULATION

(71) Applicant: Infineon Technologies AG, Neubiberg (DE)

(72) Inventors: Paolo Milanesi, Padua (IT); Roberto Penzo, Chioggia (IT); Maurizio Galvano, Padua (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/530,368

(22) Filed: Oct. 31, 2014

(51) Int. Cl.
*H05B 37/02* (2006.01)
*H05B 33/08* (2006.01)
*H02M 3/158* (2006.01)

(52) U.S. Cl.
CPC ........... *H05B 33/0815* (2013.01); *H02M 3/158* (2013.01)

(58) Field of Classification Search
CPC .................................................. H05B 33/0815
USPC ................................................ 315/193, 291
See application file for complete search history.

(56) References Cited

U.S. PATENT DOCUMENTS

| 6,150,968 A * | 11/2000 | Tsay | H03M 1/1061 |
| | | | 341/139 |
| 2005/0128118 A1* | 6/2005 | Devendorf | H03K 5/2418 |
| | | | 341/158 |
| 2014/0247027 A1* | 9/2014 | Kobayashi | H02M 3/158 |
| | | | 323/271 |

* cited by examiner

*Primary Examiner* — Don Le

(74) *Attorney, Agent, or Firm* — Shumaker & Sieffert, P.A.

(57) ABSTRACT

A current regulator controller includes a differential amplifier that is arranged to output a current sense signal based on a differential input signal and a first stage trim signal. The current regulator controller also includes a first stage trim circuit that is arranged to provide the first stage trim signal. The current regulator controller also includes a digital-to-analog converter that is arranged to provide a set signal based on a digital input signal and a second stage trim signal. The current regulator controller also includes a second stage trim circuit that is arranged to provide the second stage trim signal. The current regulator controller also includes an error amplifier that is arranged to output an error signal based on the set signal and the current sense signal. The regulation of the current is based on the error signal.

20 Claims, 14 Drawing Sheets

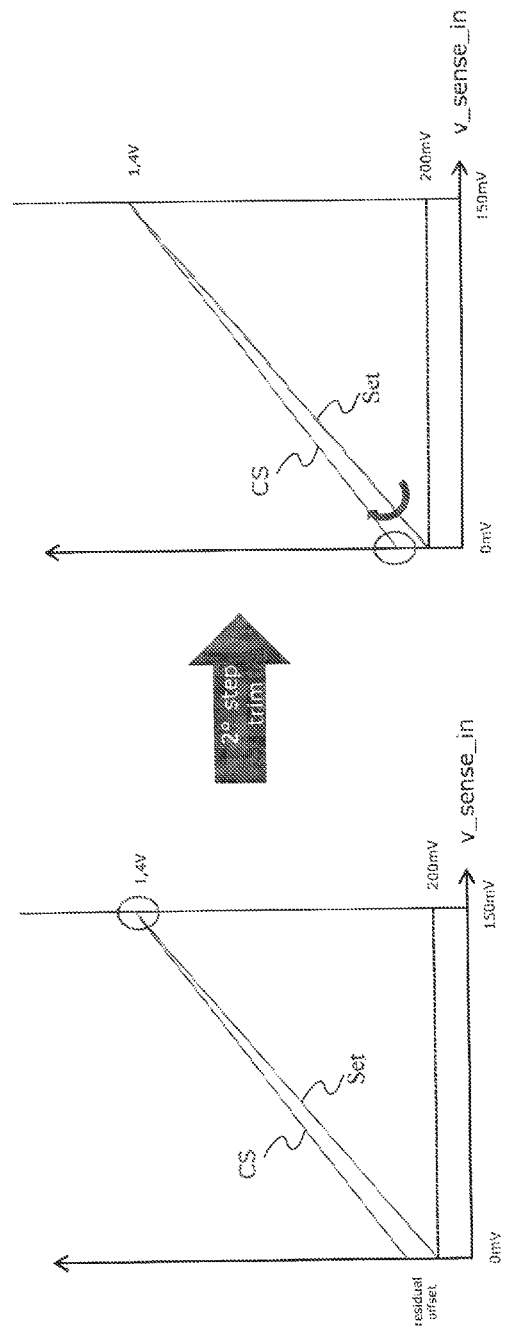
FIG. 5B
FIG. 5A
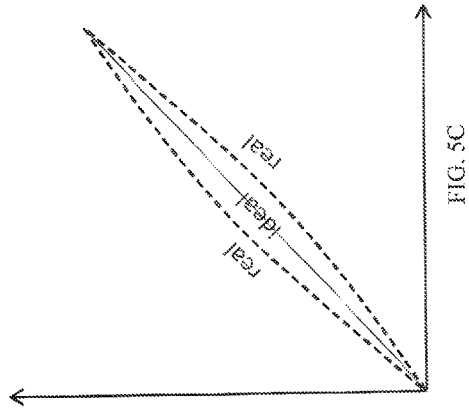
FIG. 5C

US 9,326,335 B1

SECOND STAGE CALIBRATION IN DC/DC LED CURRENT REGULATION

TECHNICAL FIELD

This disclosure relates to electronic circuits, and more specifically to second stage calibration in DC/DC LED current regulation.

BACKGROUND

Illumination devices (e.g., lamps) that comprise light emitting diodes (LEDs) as luminescent components usually cannot simply be connected to a voltage supply but have to be driven by special driver circuits (or control circuits) providing a defined load current to the LEDs in order to provide a desired radiant power (radiant flux). Since a single LED exhibits only small forward voltages (from about 1.5 V for infrared GaAs LEDs ranging up to 4 V for violet and ultraviolet InGaN LEDs) compared to commonly used supply voltages (for example, 12 V, 24 V and 42 V in automotive applications) several LEDs are typically connected in series to form so-called LED chains.

LEDs are current-driven components and that typically employ driver circuits including a load current regulation. In order to reduce power dissipation within the driver circuits, switched-mode power supplies are usually employed to supply an LED or LED chain with a well-defined load current.

SUMMARY

In some examples, a current regulator controller includes a differential amplifier that is arranged to output a current sense signal based on a differential input signal and a first stage trim signal. The current regulator controller may include a first stage trim circuit that is arranged to provide the first stage trim signal. The current regulator controller may also include a digital-to-analog converter that is arranged to provide a set signal based on a digital input signal and a second stage trim signal. The current regulator controller may also include a second stage trim circuit that is arranged to provide the second stage trim signal. In addition, the current regulator controller may include an error amplifier that is arranged to output an error signal based on the set signal and the current sense signal. The regulation of the current is based on the error signal.

In some examples, a method comprises controlling regulation of a current. Controlling the regulation of the current may include: outputting a first stage trim signal; outputting a current sense signal based, at least in part, on a differential input signal and the first stage trim signal; outputting a second stage trim signal; performing a digital-to-analog conversion to output a set signal based, at least in part, on a digital input signal and the second stage trim signal; and outputting an error signal based, at least in part, on the set signal and the current sense signal. The regulation of the current is based, at least in part, on the error signal.

In some examples, a method comprises employing an error amplifier of a current regulator controller to output an error signal based, at least in part, on a current sense signal and a set signal; calibrating a current sense gain of a differential amplifier circuit of the current regulator controller to determine a first trim value, wherein the differential amplifier circuit is arranged to output the current sense signal; and calibrating an offset of a digital-to-analog converter to determine a second trim value. The digital-to-analog converter is arranged to output the set signal.

In some examples, calibrating the offset of the digital-to-analog converter to determine the second trim value includes performing front-end trimming and further includes performing an in-field end-of-line calibration.

In other examples, calibrating the offset of the digital-to-analog converter to determine the second trim value includes performing front-end trimming and does not include performing an in-field end-of-line calibration.

In yet other examples, calibrating the offset of the digital-to-analog converter to determine the second trim value includes performing an in-field end-of-line calibration and does not include performing front-end trimming.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

Non-limiting and non-exhaustive examples of the present disclosure are described with reference to the following drawings.

FIG. 5A is a plot diagram of the voltage of an example of signal CS and the voltage of an example of signal Set versus the voltage of an example of the differential input signal after the first stage trimming and before the second stage trimming.

FIG. 5B is a plot diagram of the voltage of an example of signal CS and the voltage of an example of signal Set versus the voltage of an example of the differential input signal with the second stage trimming.

FIG. 5C is a plot diagram of the output current versus the level of analog dimming after first stage trimming and second stage trimming.

DETAILED DESCRIPTION

Figure 1:
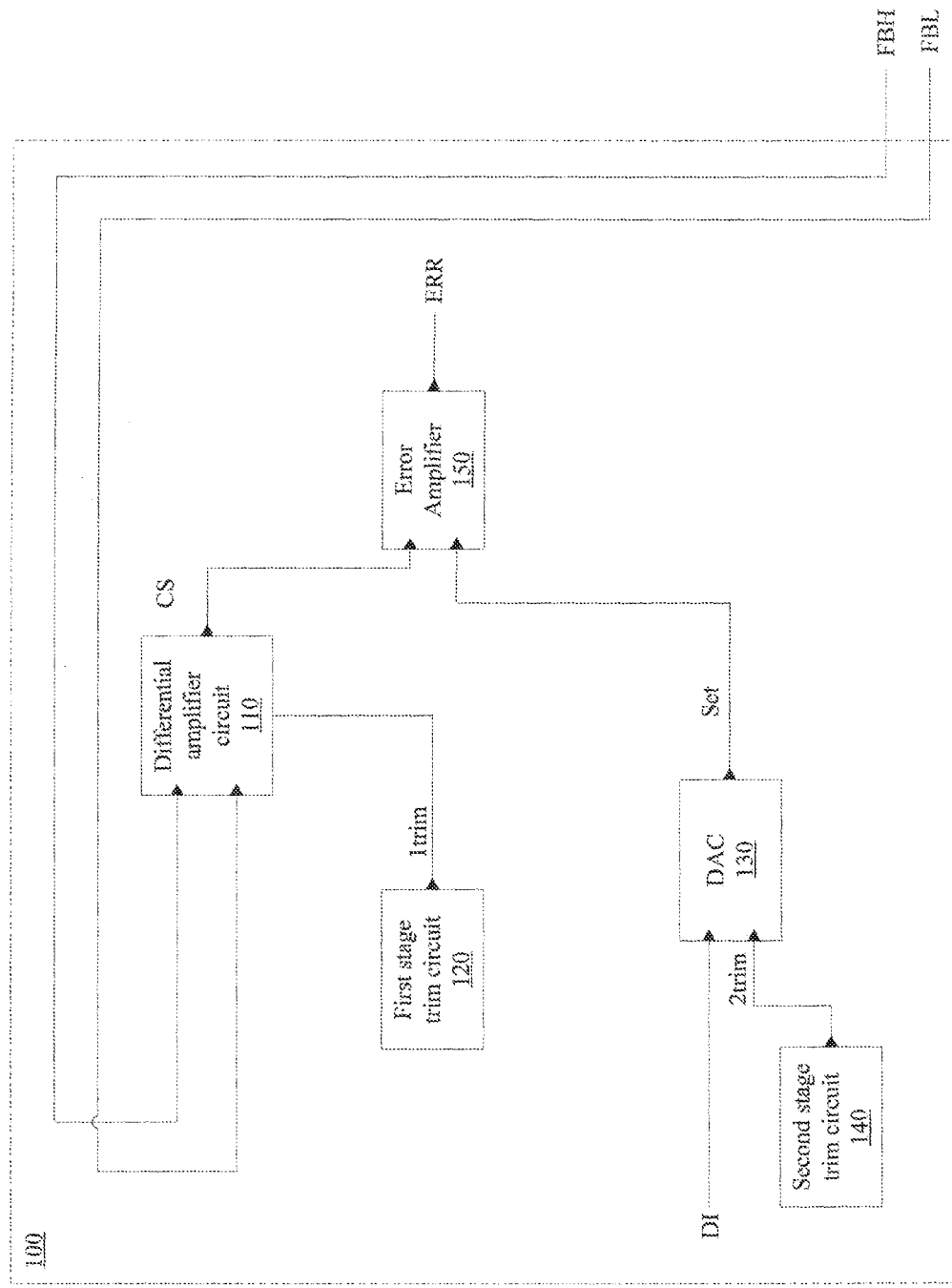
FIG. 1 is a block diagram illustrating an example of a current regulator controller.

Various examples of this disclosure will be described in detail with reference to the drawings, where like reference numerals represent like parts and assemblies throughout the several views. Reference to various examples does not limit the scope of this disclosure which is limited only by the scope of the claims attached hereto. Additionally, any examples set forth in this specification are not intended to be limiting and merely set forth some of the many possible examples of this disclosure.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," or "in one example," as used herein does not necessarily refer to the same embodiment or example, although it may be the case. Similarly, the phrase "in some embodiments," or "in some examples," as used herein, when used multiple times, does not necessarily refer to the same embodiments or examples, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. Where suitable, the term "gate" is intended to be a generic term covering both "gate" and "base"; the term "source" is intended to be a generic term covering both "source" and "emitter"; and the term "drain" is intended to be a generic term covering both "drain" and "collector." The term "coupled" means at least either a direct electrical connection between the items connected, or an indirect connection through one or more passive or active intermediary devices. The term "signal" means at least one current, voltage, charge, temperature, data, or other signal.

Briefly stated, a current regulator controller includes a differential amplifier that is arranged to output a current sense signal based on a differential input signal and a first stage trim signal. The current regulator controller also includes a first stage trim circuit that is arranged to provide the first stage trim signal. The current regulator controller also includes a digital-to-analog converter that is arranged to provide a set signal based on a digital input signal and a second stage trim signal. The current regulator controller also includes a second stage trim circuit that is arranged to provide the second stage trim signal. The current regulator controller also includes an error amplifier that is arranged to output an error signal based on the set signal and the current sense signal. The regulation of the current is based on the error signal.

FIG. 1 is a block diagram illustrating an example of current regulator controller 100. Current regulator controller 100 includes differential amplifier circuit 110, first stage trim circuit 120, digital-to-analog converter (DAC) 130, second stage trim circuit 140, and error amplifier 150.

In some examples, current regulator 100 is arranged to operate as follows. Differential amplifier circuit 110 is arranged to output current sense signal CS based, at least in part, on differential input signal FBH/FBL and first stage trim signal 1trim. First stage trim circuit 120 is arranged to provide first stage trim signal 1trim. Digital-to-analog converter (DAC) 130 is arranged to output set signal Set based, at least in part, on digital input signal DI and second stage trim signal 2trim. Second stage trim circuit 140 is arranged to provide second stage trim signal 2trim. Error amplifier 150 is arranged to output error signal ERR based, at least in part, on signal Set and signal CS. Accordingly, error amplifier 150 is arranged to force signal CS to be close to signal Set via negative feedback. Current regulator controller 100 is arranged to control regulation of a load current/output current (not shown in FIG. 1), such that the regulation of the load current is based, at least in part, on signal ERR. In some examples, current regulator controller 100 controls regulation of the load current as a constant current via DC/DC switching regulation control, sensing the load current via differential input signal FBH/FBL. In some examples, the regulated load current is adjustable.

Figure 2:
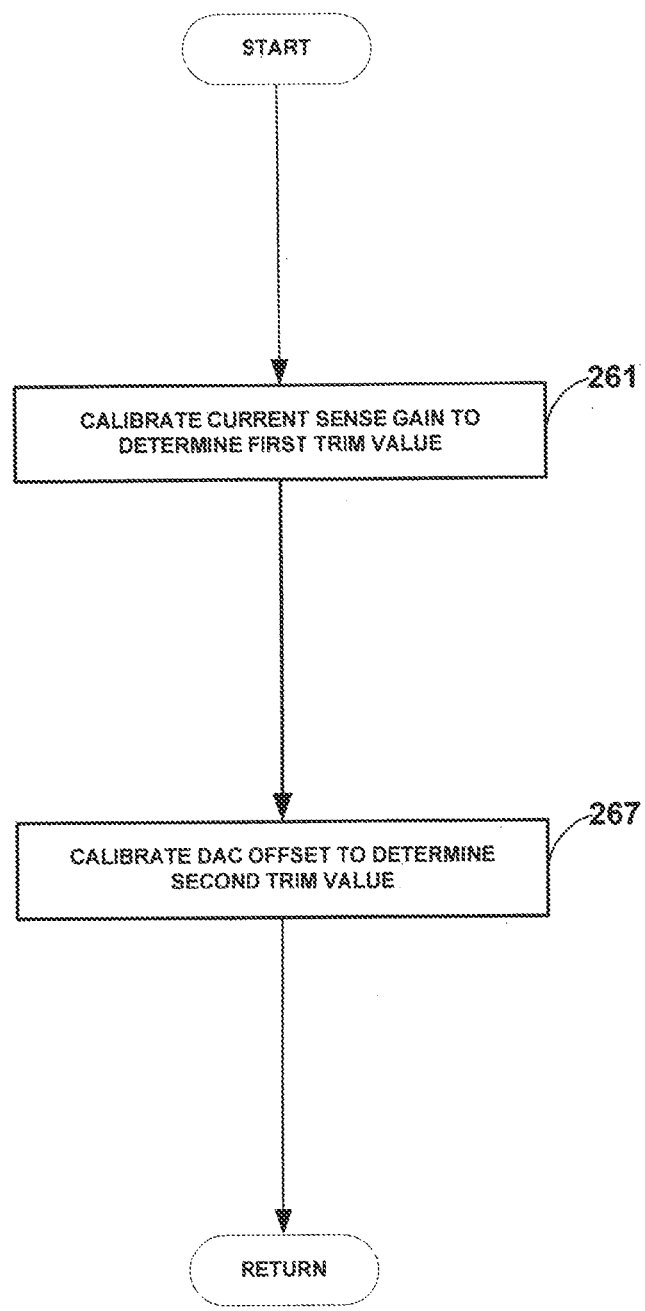
FIG. 2 is a flow diagram illustrating an example of a process for determining trim values.

FIG. 2 is a flow diagram illustrating an example of a process (260) for determining trim values. In one example, process 260 proceeds as follows. After a start block, first stage trim circuit 120 calibrates the current sense gain (associated with differential amplifier 110) to determine a first trim value (261). In some examples, at step 261, first stage trim circuit calibrates the current sense gain at a single trim point of the maximum value of the output current. Next, second stage trim circuit 140 calibrate the DAC offset (associated with DAC 140) to determine a second trim value (267). The process then advances to a return block, where other processing is resumed.

Figure 3:
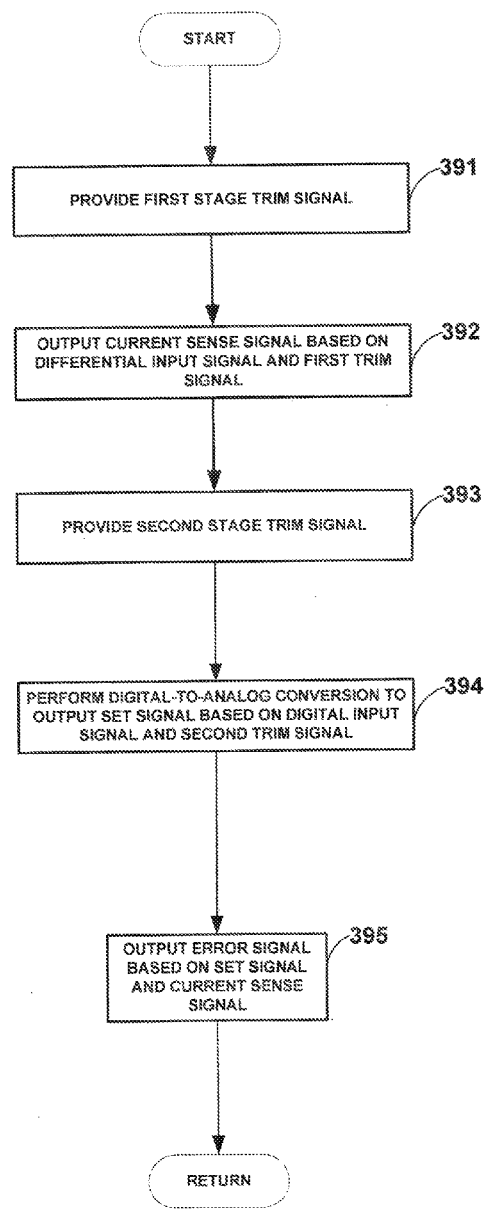
FIG. 3 is a flow diagram illustrating an example of a process for current regulation with trimming based on determined trim values.

FIG. 3 is a flow diagram illustrating an example of a process (390) for current regulation with trimming based on determined trim values (e.g., the first and second trim value determined by an example of the process of FIG. 2).

In one example, process 390 proceeds as follows. After a start block, first stage trim circuit 120 provides first stage trim signal 1trim (391). Next, differential amplifier circuit 110 outputs current sense signal CS based, at least in part, on differential input signal FBH/FBL and first stage trim signal 1trim (392). Second stage trim circuit 140 then provides second stage trim signal 2trim (393). Next, digital-to-analog converter (DAC) 130 outputs set signal Set based, at least in part, on digital input signal DI and second stage trim signal 2trim (394). Then, error amplifier 150 outputs error signal ERR based, at least in part, on signal Set and signal CS (395). The process then advances to a return block, where other processing is resumed.

Figure 4B:
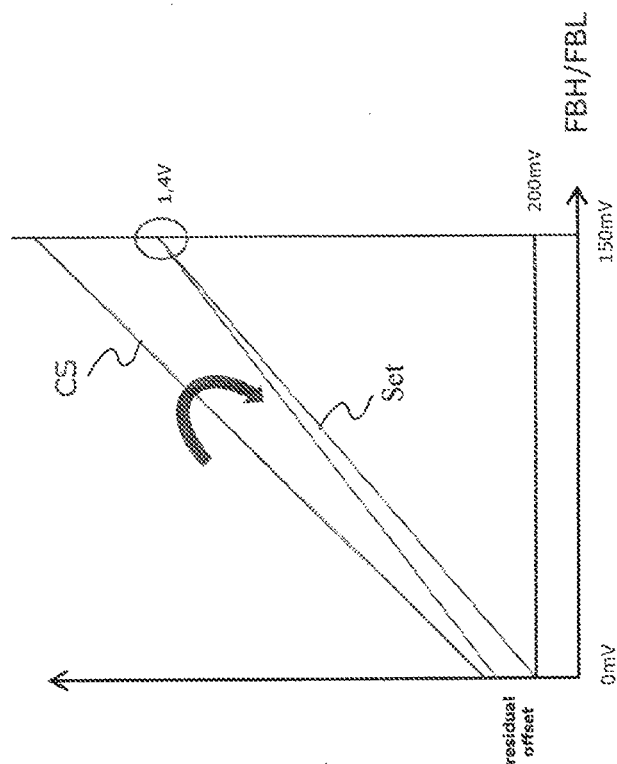
FIG. 4B is a plot diagram of the voltage of an example of signal CS and the voltage of an example of signal Set versus the voltage of an example of the differential input signal after the first stage trimming.
Figure 4A:
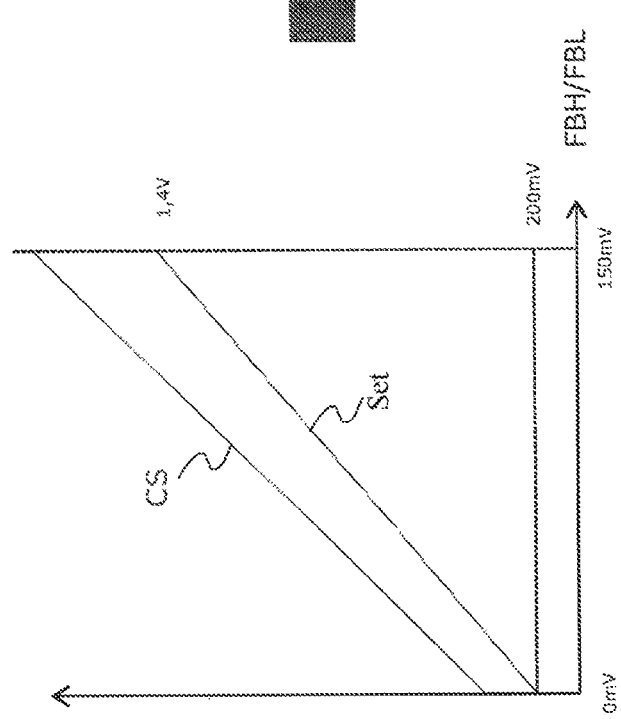
FIG. 4A is a plot diagram of the voltage of an example of signal CS and the voltage of an example of signal Set versus the voltage of an example of the differential input signal before trimming.

FIG. 4A is a plot diagram of a waveform of the voltage of an example of signal CS and a waveform of the voltage of an example of signal Set versus the voltage of an example of the differential input signal before trimming.

In some examples, it may be desirable for the waveforms of signal CS and signal Set to be identical to each and in such examples the waveforms would entirely overlap each other. However, due to errors from the ideal characteristics, the waveforms differ from each other as illustrated in FIG. 4A in accordance with one example.

In the examples shown in FIG. 4A, FIG. 4B, FIG. 5A, and FIG. 5B, the voltage associated with Set varies from 200 mV to 1400 mV, for use in providing analog dimming to vary the current from a minimum dimming value (zero) to a maximum analog dimming value that corresponds to the differential input voltage being 150 mV at the maximum analog dimming value. In other examples, other suitable values may be employed within the scope and spirit of the disclosure.

FIG. 4B is a plot diagram of a waveform of the voltage of an example of signal CS and a waveform of the voltage of an example of signal Set versus the voltage of an example of the differential input signal after the first stage trimming.

The first stage trimming may modify the current sense gain associated with the differential amplifier circuit (e.g., differential amplifier circuit 110) so that Set and CS are equal to each other at the maximum analog dimming value. However, after the first stage trimming and before the second stage trimming, there may be a residual offset and other values of analog dimming, particularly at the minimum value of analog dimming.

FIG. 5A is a plot diagram of the voltage of an example of signal CS and the voltage of an example of signal Set versus the voltage of an example of the differential input signal after the first stage trimming and before the second stage trimming. In the example shown in FIG. 5A, with only the first stage trimming performed, there is only optimum accuracy at the single trimmed point (the maximum value of the current), and the output current accuracy decreases as the analog dimming values decrease. FIG. 5B is a plot diagram of the voltage of an example of signal CS and the voltage of an example of signal Set versus the voltage of an example of the differential input signal with the second stage trimming. In the example shown, after the second stage trim, the characteristic of signal Set is modified to match signal CS at the minimum value of analog dimming.

FIG. 5C is a plot diagram of the output current versus the level of analog dimming in accordance with aspects of the disclosure. As shown, with first trim and second trim applied, the real output current is substantially the same as the ideal output current at both minimum analog dimming and maximum analog dimming.

Figure 6:
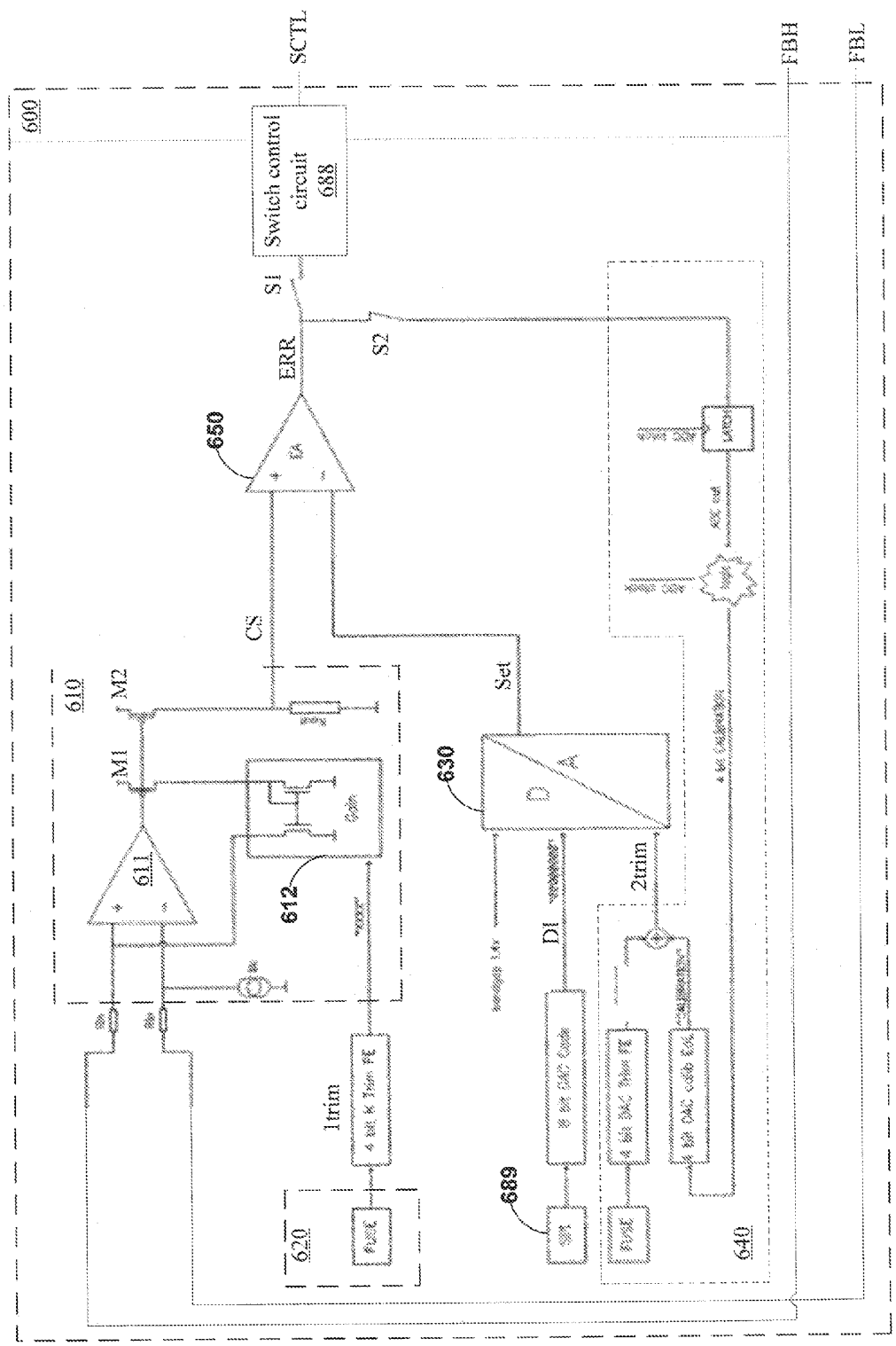
FIG. 6 is a block diagram illustrating an example of the current regulator controller of FIG. 1.

FIG. 6 is a block diagram illustrating an example of current regulator controller 600, which may be employed as an example of current regulator controller 100 of FIG. 1. Although not shown, error amplifier 650 may include a compensation network, including a capacitor, which may be external or internal in various examples. An example of regulator controller 600 further includes internal switch S1, internal switch S2, SPI block 689, and switch control circuit 688. Switch control circuit 688 may be arranged to provide switch control signal(s) SCTL from signal ERR, such that switch control signal(s) SCTL turn on and off one or more switches external to regulator controller 600 (not shown in FIG. 6) to regulate the load current (not shown in FIG. 6) as a constant current based on error signal ERR. The load current may be sensed via differential input signal FBH/FBL, thus completing the feedback loop for the current regulation.

As discussed above, current regulator controller 600 controls regulation of the load current. In some examples, differential amplifier circuit 610 senses the load current via differential input signal FBH/FBL, and provides current sense signal CS based on the sensed current. Differential amplifier circuit 610 has a gain value that is trimmed based on signal 1trim.

In some examples, first stage trim circuit 620 is arranged to provide signal 1trim. First stage trim circuit 620 may have a first trim value stored in a fuse block, where the first trim value is communicated to differential amplifier circuit 610 via signal 1trim. As shown in FIG. 6, in some examples, signal 1trim is a four-bit digital trim signal.

In some examples, differential amplifier circuit 610 is arranged such that differential amplifier circuit 610 has a variable gain, such that the variable gain is controlled based on first stage trim signal 1trim. More specifically, in some examples, differential amplifier circuit 610 is arranged to output current sense signal CS such that a voltage associated with current sense signal CS is equal to a voltage associated with differential input signal FBH/FBL times a gain value that is associated with first trim signal 1trim. In some examples, the digital value of first trim signal is an offset associated with the gain value.

Differential amplifier circuit 610 may include differential amplifier 611, gain circuit 612, current source Idc, transistor M1, transistor M2, and resistor Rout. In some examples, current source Idc is arranged to provide an offset to the input of differential amplifier circuit 610. In some examples, gain circuit 612 is arranged to provide an adjustable output gain to differential amplifier circuit 610. In some examples, transistors M1 and M2 operate as a current mirror to mirror the current provided by gain circuit 612.

In some examples, gain circuit 612 is a current DAC that provides a current that is proportional to the digital value of signal 1trim. In other examples, the current is proportional to a total gain value that is equal to a fixed gain value plus the digital value of signal 1trim. The current output by gain circuit 612 may be mirrored by current mirror M1/M2 and provided to resistor Rout. In some examples, resistor Rout is arranged to provide signal CS by converting the mirrored current into a voltage.

In some examples, error amplifier 650 is arranged to control the regulation by comparing the sensed current via signal CS with a reference signal, Set, so that signal Set effectively defines the constant current to which the output current is to be regulated.

The constant current to which the load current is regulated can be adjusted by analog dimming. The analog dimming feature may adjust the average load current via the control of error amplifier 650. The analog dimming may be performed by signal Set acting as a variable reference for error amplifier 650, where the variable reference is adjusted by DAC 630. The analog dimming may be performed by adjusting signal DI through SPI 689 and thereby adjusting signal Set.

In some examples, DAC 630 is configured to provide signal Set at the minimum value for signal Set (0.2V in one example) when signal DI is at the minimum value (e.g., DAC 630 provides signal Set at the minimum value for signal Set when all bits of signal DI are zero), and to provide signal Set at the maximum value of signal Set (1.4V in one example) when signal DI is at the maximum value (e.g., DAC provides signal Set at the maximum value for signal Set when all bits of signal DI are one). Internal switch S1 may be arranged to disconnect signal ERR from the switch control during calibration. Internal switch S2 may be arranged to close the output loop during calibration.

SPI block 689 may provide an external interface usable by the customer to communicate with current regulator controller 600 and to enable, whenever it is required, the trimming procedure. SPI block 689 may provide an external interface usable by the customer to control the analog dimming. During normal operation, the customer can interface with current regulator controller to allow the user to control the value of signal DI output by SPI block 689.

SPI block 689 may be arranged to provide signal DI, which is an 8-bit digital signal in some examples. During normal operation, signal DI may be externally controllable so that analog dimming may be externally controlled. In contrast, during calibration, SPI block 689 may provide signal DI at an appropriate level in accordance with the algorithm for the trimming and/or calibration being performed, as discussed in greater detail below, for example with regard to FIG. 12-FIG. 14.

In some examples, SPI block 689 may be replaced with another suitable communication interface.

DAC 630 may control the analog dimming. In some examples, DAC 630 is arranged to receive a reference voltage, such as a bandgap voltage as illustrated in FIG. 6, and to receive signal DI as an eight-bit digital signal. In some examples, DAC 630 is arranged such that DAC has a variable offset, such that the variable offset is controlled based on second stage trim signal 2trim. More specifically, in some examples, DAC 630 is arranged to perform analog-to-digital conversion to convert digital input signal DI into set signal Set such that the digital-to-analog conversion is offset based on second stage trim signal 2trim.

Second stage trim circuit 640 is arranged to provide trim signal 2trim. Second stage trim circuit 640 may include a fuse block, a summer, a latch, and a logic block, which operate as follows in one example. In some examples, the fuse block is arranged to provide a four-bit front-end trim signal. In some examples, the latch and the logic block are arranged to perform end-of-line calibration and to provide a four-bit second stage calibration signal during operation. In some examples, the summer sums the value of the four-bit front-end trim signal and the four-bit end of line calibration signal to provide signal 2trim.

Although second stage trim circuit 640 as illustrated in FIG. 6 and discussed above shows an example in which the second stage calibration includes both front-end trimming and in-field end-of-line calibration, in other examples, the second stage calibration includes front-end trimming but does not includes in-field end-of-line calibration, and in yet other examples, the second stage calibration includes in-field end-of-line calibration but does not includes front-end trimming. These examples and others are within the scope and spirit of the disclosure.

Figure 7:
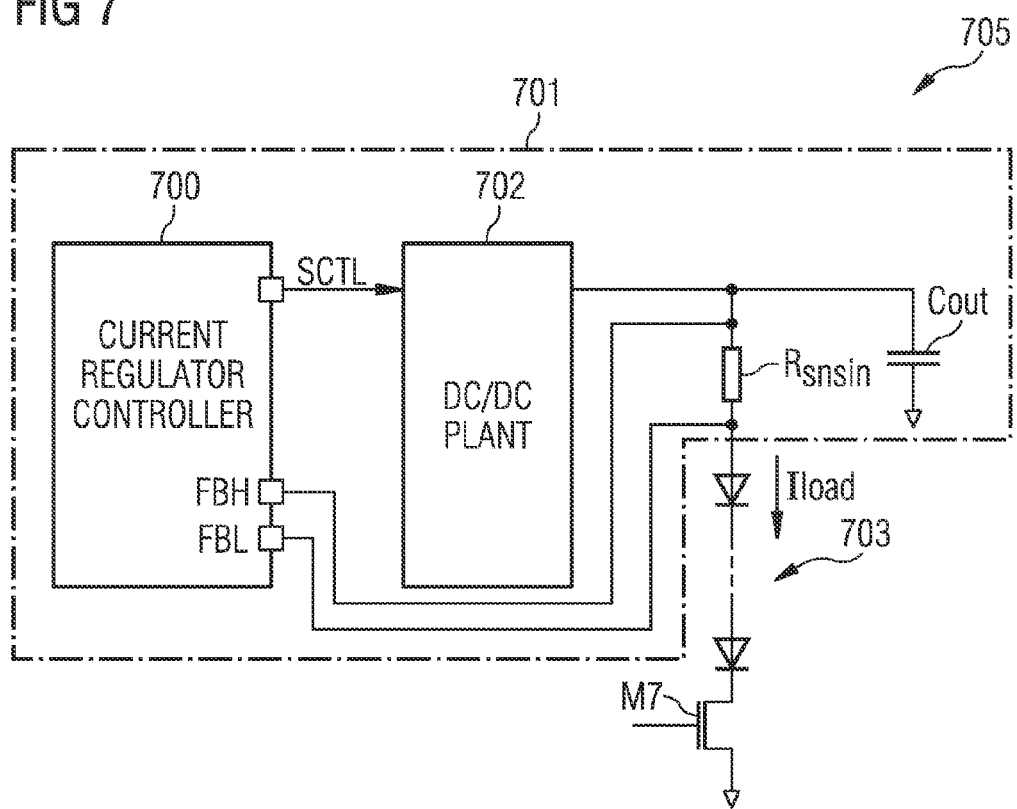
FIG. 7 is a block diagram of an example of a current regulator driving an LED string load, where the current regulator includes an example of the current regulator controller of FIG. 1 and/or FIG. 6.

FIG. 7 is a block diagram of an example of circuit 705. Circuit 705 includes current regulator 701, LED string load 703, and transistor M7. Current regulator 701 includes DC/DC plant 702, current sense resistor Rsnsin, output capacitor Cout, and current regulator controller 700. Current regulator controller 700 is an example of current regulator controller 100 of FIG. 1 and/or current regulator controller 600 of FIG. 6.

In operation, LED string load 703 is driven by load current Iload, where current Iload is regulated by current regulator 701. In some examples, current regulator 701 regulates load current Iload as a constant current via a negative feedback based on differential input signal FBH/FBL. In some examples, differential input signal FBH/FLB is generated by resistor Rsnsin, where resistor Rsnsin is in series with LED string load 703. In some examples, because resistor Rsnsin is in series with LED string load 703, current Iload flows through resistor Rsnsin, and the voltage across resistor Rsnsin (FBH/FBL) is proportional to current Iload. Capacitor Cout may be arranged to operate as an output capacitor for current regulator 601.

In some examples, transistor M7 operates as follows. Transistor M7 is arranged to operate as a digital dimming transistor. Transistor M7 switches on and off continuously to provide dimming; the equivalent load current is equal to the average current between the time transistor M7 is on and the time transistor M7 is off (the current is zero when transistor M7 is off), while ensuring that the off time is less than the retention time of output capacitor Cout. The effective brightness of the light of the external LEDs driven by the load current is proportional to the duty cycle of transistor M7.

DC/DC plant 702 includes one or more switches that are controller by switch control signal(s) SCTL to regulate load current Iload. In some examples, DC/DC plant 702 has a buck-boost topology. In other examples, DC/DC plant 702 has a topology other than a buck/boost topology, such as a boost topology, buck topology, and/or any suitable DC/DC converter topology. Also, although in the example shown in FIG. 7 the load voltage is referenced to ground, in other examples, the load voltage may be referenced to the power supply. These variations and others are within the scope and spirit of the disclosure.

Figure 8:
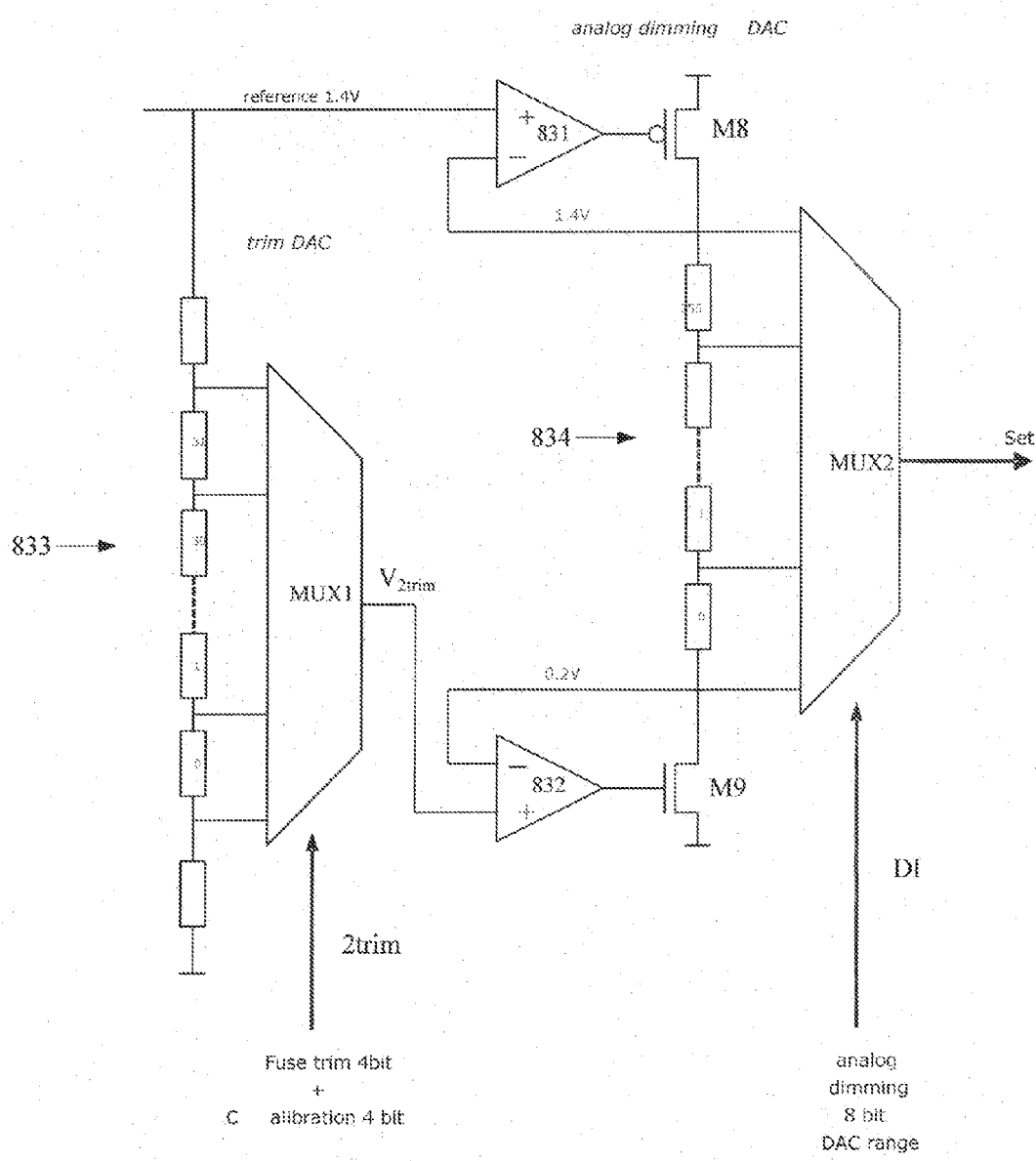
FIG. 8 is a block diagram of an example of the DAC of FIG. 6.

FIG. 8 is a block diagram of an example of DAC 830, which may be employed as an example of DAC 630 of FIG. 6. DAC 830 includes amplifiers 831 and 832, transistors M8 and M9, multiplexers MUX1 and MUX2, and resistors string 833 and 834.

FIG. 8 and the discussion of FIG. 8 below relates to some non-limiting examples of DAC 830, although other suitable examples are also within the scope and spirit of the disclosure. Accordingly, the example of FIG. 8 is merely one example, and is not necessarily limiting of a DAC that may be used in accordance with this disclosure.

As shown in FIG. 8, resistor string 833 and multiplexer MUX1 operate together as one DAC which converts digital signal 2trim into an analog signal $V_{2trim}$. Resistor string 834, multiplexer MUX2, transistors M8 and M9, and amplifiers 833 and 834 operate together as another DAC which converts digital signal DI into an analog signal, Set (with a value from 0.2V minimum for 00000000 from 1.4V maximum for 11111111 and each other value spaced equally between 0.2V and 1.4V), adjusted an offset corresponding to analog voltage $V_{2trim}$.

Resistor string 834, multiplexer MUX2, transistors M8 and M9, and amplifiers 833 and 834 operate together as a primary DAC to convert digital signal DI into analog signal, Set. Resistor string 833 and multiplexer MUX1 operate together as a secondary DAC that generates the reference for the bottom regulator of the primary DAC, and adjusts the generated reference to modify the origin of the characteristic of the primary DAC. In this way is possible to modify the signal Set characteristic in order to match the current set signal CS characteristic at minimum value of analog dimming.

Figure 9:
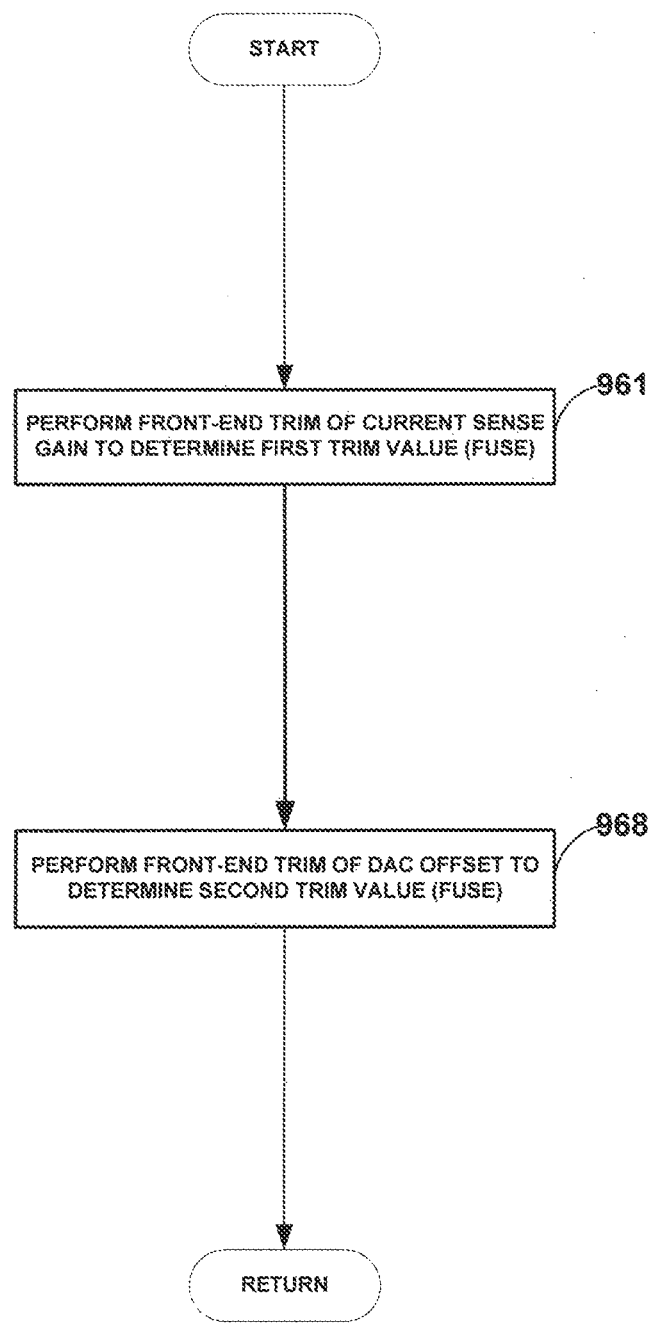
FIG. 9 is a flow diagram illustrating an example of the process of FIG. 2.

FIG. 9 is a flow diagram illustrating an example of process 960, which may be employed as an example of process 260 of FIG. 2. Process 960 may be performed, for example, by an example of current regulator controller 100 of FIG. 1 or current regulator controller 600 of FIG. 6.

After a start block, during factory front-end trimming, first trim circuit 620 controls front-end trimming of current sense gain of differential amplifier circuit 610 to determine a first trim value (e.g., 1trim) (961). Next, and still during factory front-end trimming, second trim circuit 640 controls second-end trimming of DAC offset in DAC 830 to determine a second trim value (e.g., 2trim) (968). The process then advances to a return block, where other processing is resumed.

Figure 10:
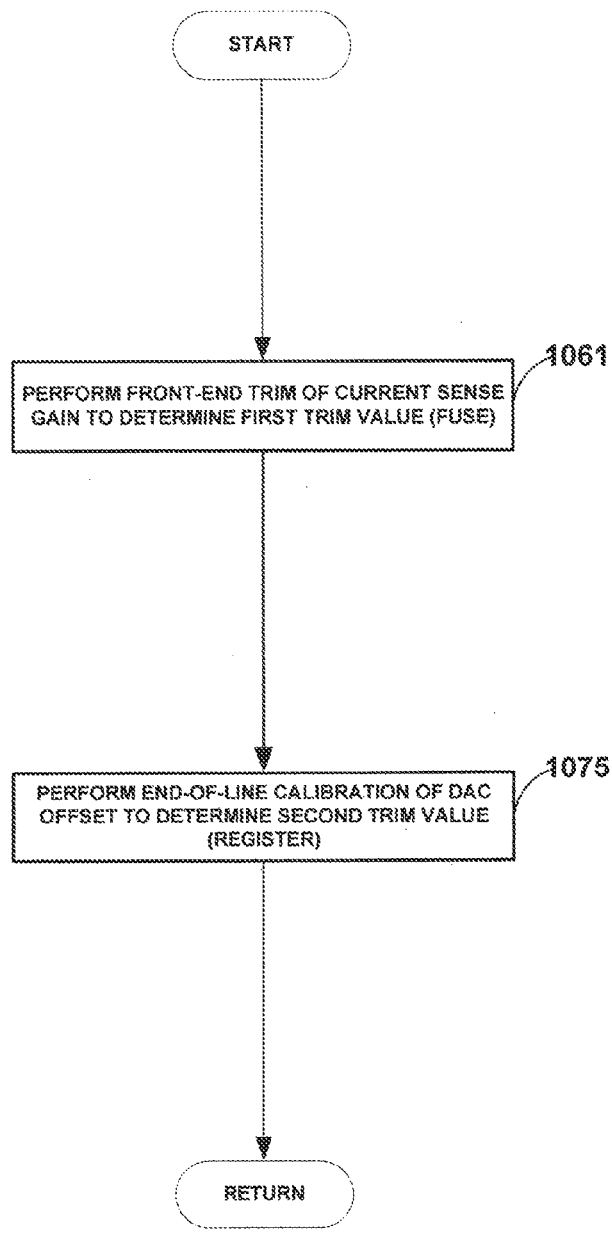
FIG. 10 is a flow diagram illustrating another example of the process of FIG. 2.

FIG. 10 is a flow diagram illustrating an example of process 1060, which may be employed as another example of process 260 of FIG. 2. Process 1060 may be performed, for example, by an example of current regulator controller 100 of FIG. 1 or current regulator controller 600 of FIG. 6.

After a start block, during factory front-end trimming, first trim circuit 620 controls front-end trimming of current sense gain of differential amplifier circuit 610 to determine a first trim value (e.g., 1trim) (1061). Next, during an in-field, end-of-line calibration process, second trim circuit 640 controls end-of-line calibration of DAC offset in DAC 830 to determine a second trim value (e.g., 2trim) (1075). The process then advances to a return block, where other processing is resumed.

Figure 11:
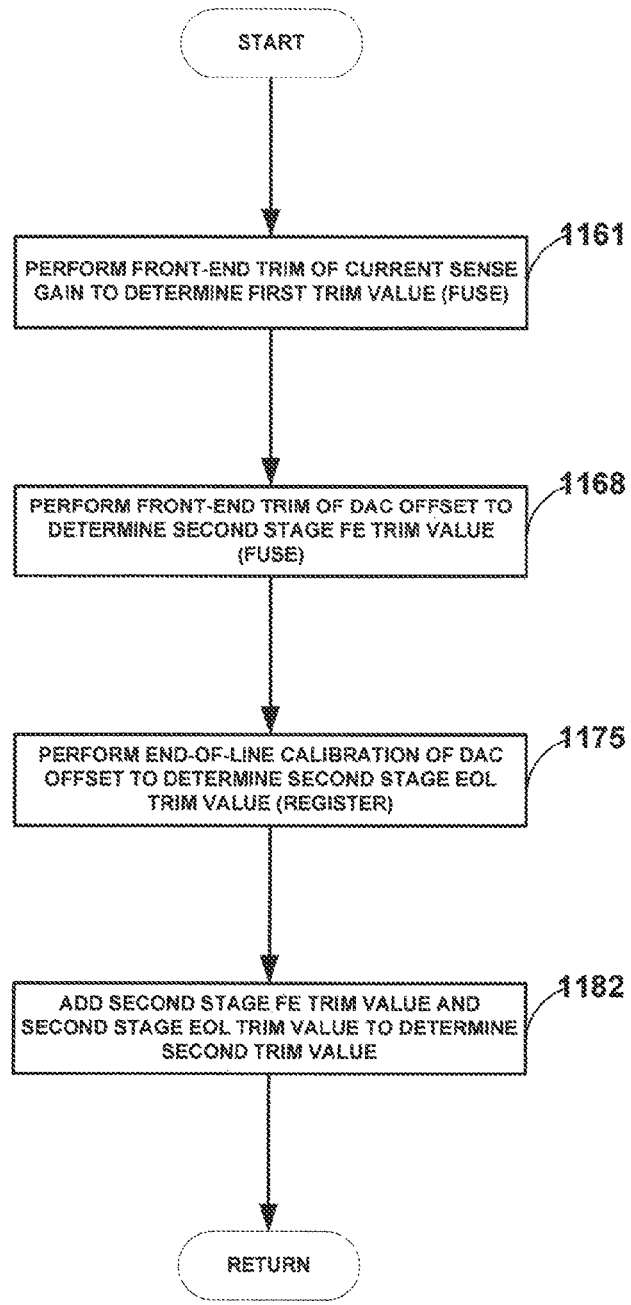
FIG. 11 is a flow diagram illustrating yet another example of the process of FIG. 2.

FIG. 11 is a flow diagram illustrating an example of process 1160, which may be employed as yet another example of process 260 of FIG. 2. Process 1160 may be performed, for example, by an example of current regulator controller 100 of FIG. 1 or current regulator controller 600 of FIG. 6.

After a start block, during factory front-end trimming, first trim circuit 620 controls front-end trimming of current sense gain of differential amplifier circuit 610 to determine a first trim value (e.g., 1trim) (1161). Next, and still during factory front-end trimming, second trim circuit 640 controls second-end trimming of DAC offset in DAC 830 to determine a second stage front end (FE) trim value (1168). In this example, step 1168 acts as coarse trimming of DAC 830. Then, during an in-field, end-of-line calibration process, second trim circuit 640 controls end-of-line calibration of DAC offset in DAC 830 to determine a second stage end-of-line (EOL) trim value (1175). In this example, step 1175 acts as fine trimming for DAC 830. Next, the second stage FE trim value and the second stage EOL trim value are added to determine the second stage trim value (2trim) (1182). The process then advances to a return block, where other processing is resumed.

Figure 12:
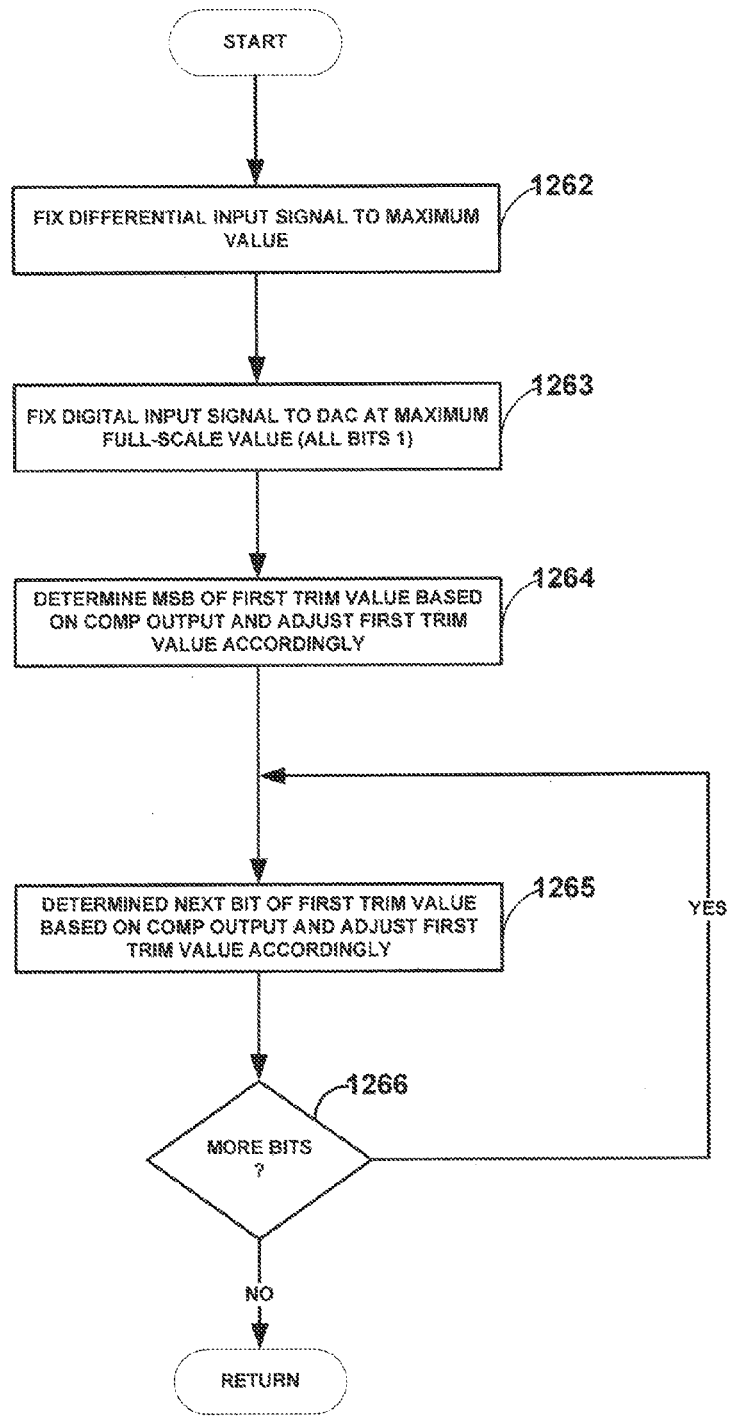
FIG. 12 is a flow diagram illustrating an example of the first stage trim process of FIGS. 9, 10, and/or 11.

FIG. 12 is a flow diagram illustrating an example of first stage trim process 1261. Process 1261 may be employed, for instance, as an example of block 961 of FIG. 9, block 1061 of FIG. 10, and/or block 1161 of FIG. 11.

After a start block, first stage trim circuit 610 causes the differential input signal to be forced to the maximum value, which is 150 mV in some examples (1262). Next, SPI block 689 provides signal DI to have the maximum full-scale value of signal DI (with all bits of signal DI being 1) (1263).

Next, first stage trim circuit 620 determines the most significant bit (MSB) of the value of first trim signal 1trim based on the comp output (signal ERR), and adjusts the value of signal 1trim accordingly (1264). Error amplifier 650 is employed as a detection comparator, comparing signal CS with signal Set. First stage trim circuit 620 determines the value of the MSB of signal 1trim based on signal ERR according to whether signal CS or signal Set is greater. After the determination is made, first stage trim circuit 620 changes the value of the MSB of signal 1trim according to the determined value of the MSB (or leaves the value unchanged, if it is already the correct value).

Next, first stage trim circuit 620 determines the next bit of the value of first trim signal 1trim based on the comp output (signal ERR), and adjusts the value of signal 1trim accordingly (1265). Error amplifier 650 is employed as a detection comparator, comparing signal CS with signal Set. First stage trim circuit 620 determines the value of the current bit of signal 1trim based on signal ERR according to whether signal CS or signal Set is greater. After the determination is made, first stage trim circuit 620 changes the value of the current bit of signal 1trim according to the determined value of the next bit (or leaves the value unchanged, if it is already the correct value).

Next, a determination is made as to whether any bits of signal 1trim remain undetermined. If so, the process returns to block 1265, where first stage trim circuit 620 determines the value of the value of the next bit. Once the value of each bit has been determined, the process proceeds to a return block, where other processing is resumed.

Figure 13:
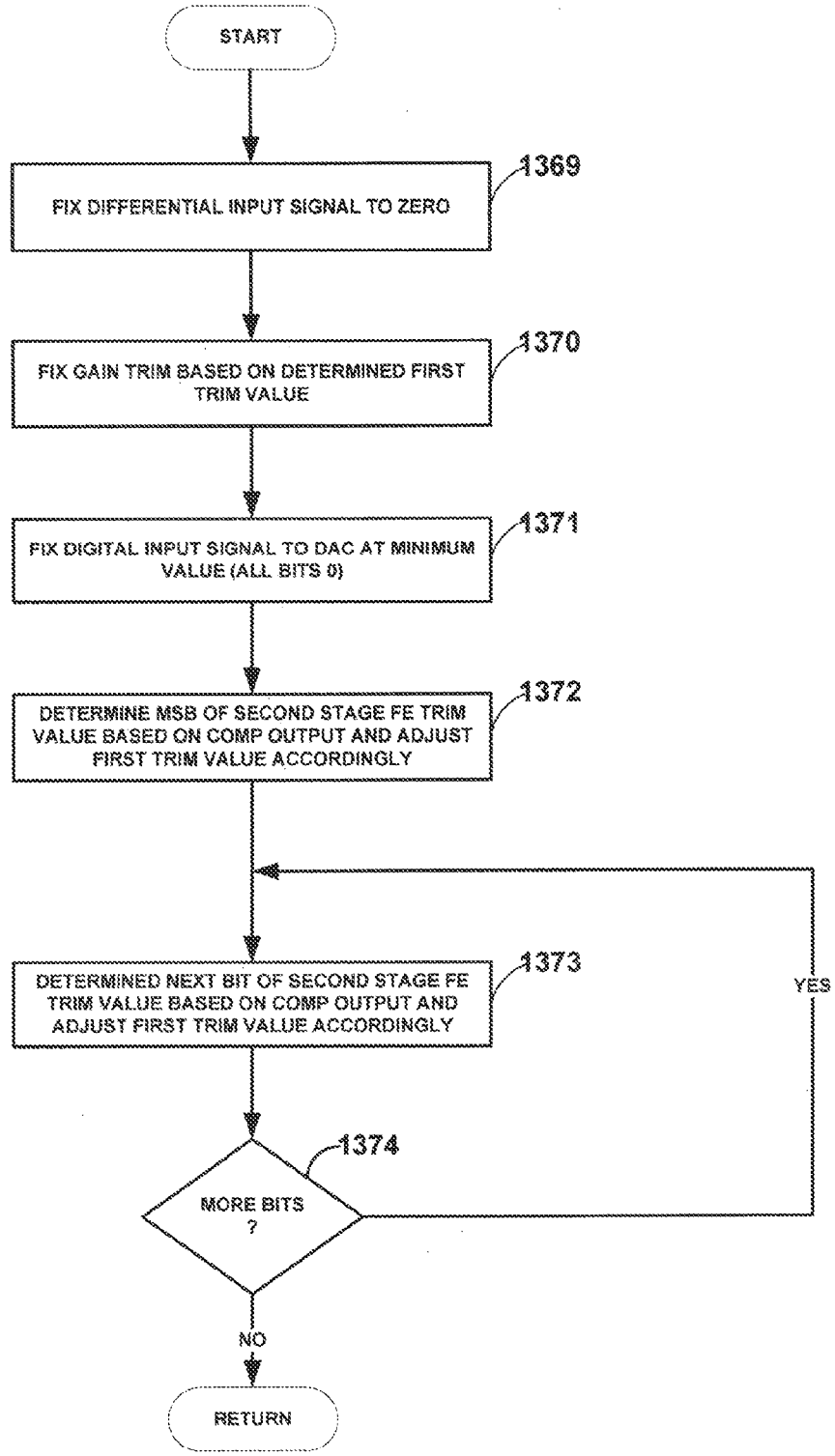
FIG. 13 is a flow diagram illustrating an example of the second stage front-end trim process of FIGS. 9 and/or 10.

FIG. 13 is a flow diagram illustrating an example of first stage trim process 1368. Process 1368 may be employed, for instance, as an example of block 968 of FIG. 9 and/or block 1068 of FIG. 10.

After a start block, second stage trim circuit 640 causes the differential input signal to be forced to the minimum value, e.g. zero (1369). For example, this may be accomplished by turning off digital dimming transistor M7 of FIG. 7. Then, first stage trim circuit 620 fixes signal 1trim based on the determined trim value. Next, SPI block 689 provides signal DI to have the minimum value of signal DI (with all bits of signal DI being 0) (1371).

Next, second stage trim circuit 640 determines the MSB of the value of the second stage FE trim value based on the comp output (signal ERR), and adjusts the value of the second stage FE trim value accordingly (1372). Error amplifier 650 is employed as a detection comparator, comparing signal CS with signal Set. Second stage trim circuit 640 determines the value of the MSB of the second stage FE trim value based on signal ERR according to whether signal CS or signal Set is greater. After the determination is made, second stage trim circuit 640 changes the value of the MSB of the second stage FE trim value according to the determined value of the MSB (or leaves the value unchanged, if it is already the correct value).

Next, second stage trim circuit 640 determines the next bit of the value of the second stage FE trim value based on the comp output (signal ERR), and adjusts the value of the second stage FE trim value accordingly (1373). Error amplifier 650 is employed as a detection comparator, comparing signal CS with signal Err. Second stage trim circuit 640 determines the value of the current bit of the second stage FE trim value based on signal ERR according to whether signal CS or signal Set is greater. After the determination is made, second stage trim circuit 640 changes the value of the current bit of the second stage FE trim value according to the determined value of the next bit (or leaves the value unchanged, if it is already the correct value).

Next, second stage trim circuit 640 determines whether any bits of the second stage FE trim value remain undetermined (1374). If so, the process returns to block 1373, where the first stage circuit determines the value of the value of the next bit. Through blocks 1372-1374, second stage trim circuit 640 iteratively determines a value of each bit of the second stage end-of-line calibration value based on the error signal. Once the value of each bit has been determined, the process proceeds to a return block, where other processing is resumed.

Figure 14:
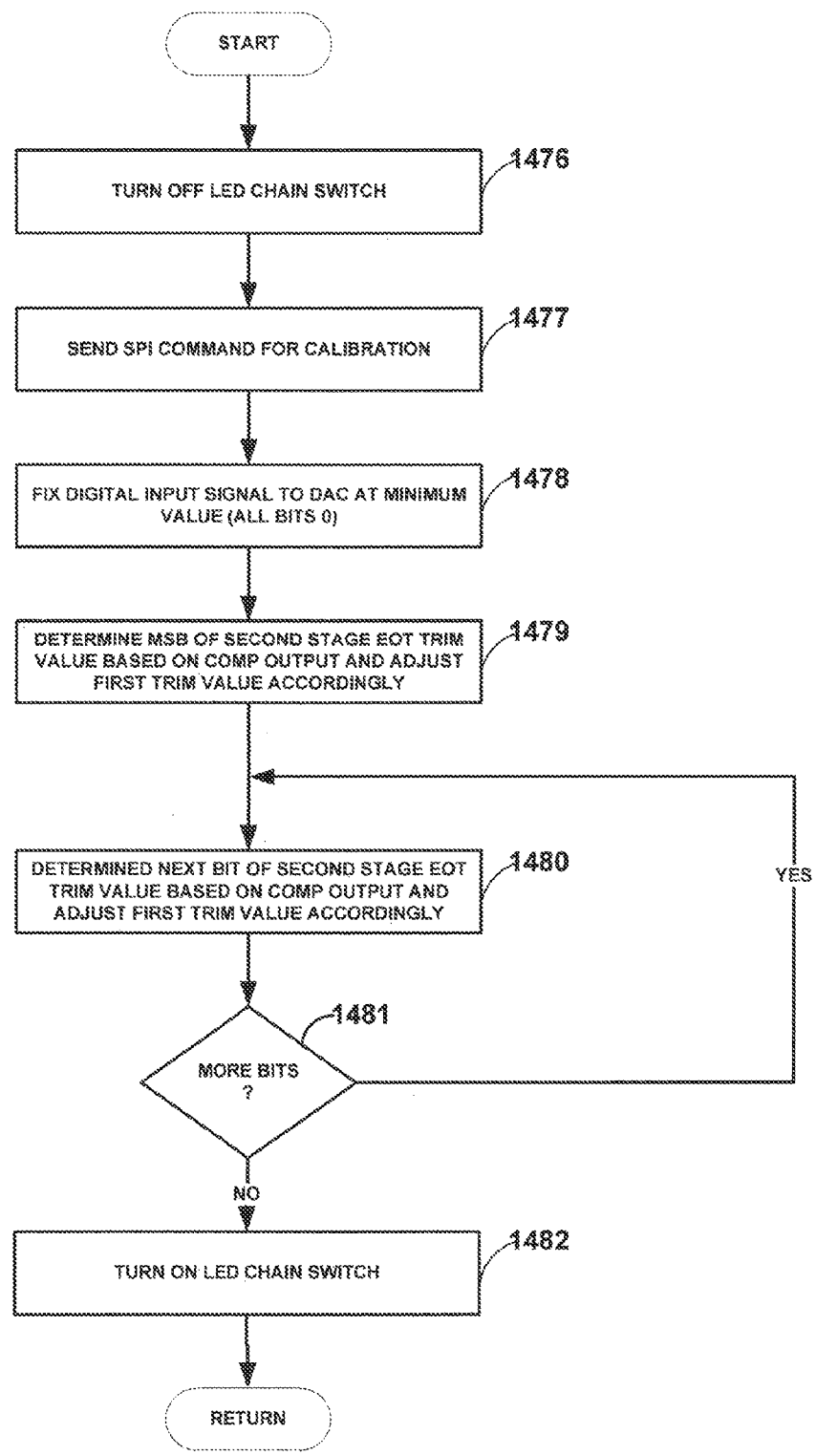
FIG. 14 is a flow diagram illustrating an example of the second stage end-of-line calibration process of FIGS. 10 and/or 11, in accordance with aspects of the present disclosure.

FIG. 14 is a flow diagram illustrating an example of first stage trim process 1475. Process 1475 may be employed, for instance, as an example of block 1075 of FIG. 10 and/or block 1175 of FIG. 11. The process of FIG. 14 is performed directly in the field.

After a start block, second stage trim circuit 640 causes the LED chain switch (e.g. transistor M7 of FIG. 7) to be turned off (1476). In this way, the output current is zero for the end-of-line calibration process of FIG. 14. Then, second stage trim circuit 640 causes SPI block 689 to send an SPI command for calibration (1477).

Next, second stage trim circuit 640 determines the MSB of the value of the second stage EOL calibration value based on the comp output (signal ERR), and adjusts the value of the second stage EOL calibration value accordingly (1479). Error amplifier 650 is employed as a detection comparator, comparing signal CS with signal Err. Second stage trim circuit 640 determines the value of the MSB of the second stage EOL calibration value based on signal ERR according to whether signal CS or signal Set is greater. After the determination is made, second stage trim circuit 640 changes the value of the MSB of the second stage EOL calibration value according to the determined value of the MSB (or leaves the value unchanged, if it is already the correct value).

Next, second stage trim circuit 640 determines the next bit of the value of the second trim stage EOL calibration value based on the comp output (signal ERR), and adjusts the value of the second stage EOL calibration value accordingly (1480). Error amplifier 650 is employed as a detection comparator, comparing signal CS with signal Err. Second stage trim circuit 640 determines the value of the current bit of the second stage EOL calibration value based on signal ERR according to whether signal CS or signal Set is greater. After the determination is made, second stage trim circuit 640 changes the value of the current bit of the second stage EOL calibration value according to the determined value of the next bit (or leaves the value unchanged, if it is already the correct value).

Next, a determination is made as to whether any bits of the second stage EOL calibration value remain undetermined (1481). If so, the process returns to block 1480, where the first stage circuit determines the value of the next bit. Through blocks 1479-11481, second stage trim circuit 640 iteratively determines a value of each bit of the second stage end-of-line calibration value based on the error signal. Once the value of each bit has been determined, second stage trim circuit 640 causes the LED chain switch (e.g. transistor M7 of FIG. 7) to be turned back on (1482). The process then proceeds to a return block, where other processing is resumed.

As discussed above, the end-of-line trimming of the process of FIG. 14 is done at zero current, which is by definition a precisely accurate value of the output current, which is used to calibrate the output current. In this way, it can be ensured that the end-of-line calibration is calibrating versus a known, accurate value of current. In some examples, causing the output current to be zero can be accomplished by turning off digital dimming transistor M7 of FIG. 7.

The second stage trimming performed by the process of FIG. 14 can be used to compensate offset and parameters deviation caused by back-end packaging stress, external components, PCT non-idealities, temperature, aging, external condition variations, and/or the like.

Various examples have been described. For example, circuits are described for current regulator controllers and trimming/calibration methods for current regulator controllers. For example, the circuits and methods described may be used for current regulation of an output current that drives an LED string, although the disclosure is not so limited, and the output current may drive other types of loads in other examples. The techniques may be employed in a number of different applications, including automotive applications in some examples. For example, a car may use a number of series LED chains for headlights, where each series LED chain has three LEDs coupled in series. There are also numerous other applications for circuits and techniques of this disclosure beyond automotive applications, including, for example consumer applications for LEDs and industrial applications for LEDs.

These and other examples are within the scope of the following claims. The above specification, examples, and data provide a description of the manufacture and use of the composition of the disclosure. Since many examples of the disclosure can be made without departing from the scope and spirit of the disclosure, the disclosure also resides in the claims hereinafter appended.

What is claimed is:
1. A device, comprising:
a current regulator controller that is arranged to control regulation of a current, wherein the current regulator controller includes:
a differential amplifier circuit that is arranged to output a current sense signal based, at least in part, on a differential input signal and a first stage trim signal;
a first stage trim circuit that is arranged to output the first stage trim signal;
a digital-to-analog converter that is arranged to output a set signal based, at least in part, on a digital input signal and a second stage trim signal;
a second stage trim circuit that is arranged to output the second stage trim signal; and
an error amplifier that is arranged to output an error signal based, at least in part, on the set signal and the current sense signal, wherein the regulation of the current is based, at least in part, on the error signal.

2. The device of claim 1, wherein the differential amplifier circuit is arranged such that the differential amplifier circuit has a variable gain, such that the variable gain is controlled based on the first stage trim signal.

3. The device of claim 1, wherein the digital-to-analog converter is arranged such that the digital-to-analog converter has a variable offset, such that the variable offset is controlled based on the second stage trim signal.

4. The device of claim 1, wherein the current regulator controller further includes a switch control circuit that is arranged to receive the error signal, and further arranged to output one or more switch control signals based on the error signal to control one or more switches to control regulation of the current based, at least in part, on the error signal.

5. The device of claim 1, wherein the differential amplifier circuit is arranged to output the current sense signal such that a voltage associated with the current sense signal is equal to a voltage associated with the differential input signal times a gain value that is based, in part, on the first trim signal.

6. The device of claim 1, wherein the digital-to-analog converter is arranged to perform analog-to-digital conversion to convert the digital input signal into the set signal such that the digital-to-analog conversion is offset based on the second stage trim signal.

7. The device of claim 1, wherein the current regulator controller is configured to perform a front-end first stage trimming to determine the first stage trim signal.

8. The device of claim 1, wherein the current regulator controller is configured to perform a second stage calibration determine the second stage trim signal, and wherein the current regulator controller is configured to perform the second stage calibration such that the second stage calibration includes a front-end trimming.

9. The device of claim 1, wherein the current regulator controller is configured to perform a second stage calibration determine the second stage trim signal, and wherein the current regulator controller is configured to perform the second stage calibration such that the second stage calibration includes an in-field end-of-line calibration.

10. The device of claim 1, wherein the current regulator controller is configured to perform a second stage calibration determine the second stage trim signal, and wherein the current regulator controller is configured to perform the second stage calibration such that the second stage calibration includes a front-end trimming and an in-field end-of-line calibration.

11. A method of controlling regulation of a current, the method comprising:
outputting a first stage trim signal;
outputting a current sense signal based, at least in part, on a differential input signal and the first stage trim signal;
outputting a second stage trim signal;
performing a digital-to-analog conversion to output a set signal based, at least in part, on a digital input signal and the second stage trim signal; and outputting an error signal based, at least in part, on the set signal and the current sense signal, wherein the regulation of the current is based, at least in part, on the error signal.

12. The method of claim 11, the method further comprising:
controlling one or more switches to control regulation of the current based on the error signal.

13. The method of claim 11, wherein outputting the current sense signal includes outputting the current sense signal such that a voltage associated with the current sense signal is equal to a voltage associated with the differential input signal times a gain value that is associated with the first trim signal.

14. The method of claim 11, wherein performing a digital-to-analog conversion to output a set signal based on a digital input signal and the second stage trim signal includes converting the digital input signal into the set signal such that the digital-to-analog conversion is offset based on the second stage trim signal.

15. A method, comprising:
using an error amplifier of a current regulator controller to output an error signal based, at least in part, on a current sense signal and a set signal;
calibrating a current sense gain of a differential amplifier circuit of the current regulator controller to determine a first trim value, wherein the differential amplifier circuit is arranged to output the current sense signal; and
calibrating an offset of a digital-to-analog converter to determine a second trim value, wherein the digital-to-analog converter is arranged to output the set signal.

16. The method of claim 15, wherein calibrating the offset of the digital-to-analog converter to determine the second trim value includes performing front-end trimming and further includes performing an in-field end-of-line calibration.

17. The method of claim 15, wherein calibrating the offset of the digital-to-analog converter to determine the second trim value includes performing a second stage front-end trimming.

18. The method of claim 17, wherein the differential amplifier circuit is arranged to output the current sense signal based, at least in part, on a differential input signal and the first trim signal, wherein the digital-to-analog converter is arranged to perform digital-to-analog conversion on a digital signal to provide the set signal such that the digital-to-analog conversion is offset based on the second trim value, and wherein performing the second stage front-end trimming includes:
providing the second stage trim signal based, at least in part, on a second stage front-end trim value;
causing the differential input signal to be zero;
causing a value that is associated with the digital input signal to be zero; and
iteratively determining a value of each bit of the second stage front-end trim value based on the error signal.

19. The method of claim 15, wherein calibrating the offset of the digital-to-analog converter to determine the second trim value includes performing an in-field end-of-line calibration.

20. The method of claim 19, further comprising:
driving a chain of light-emitting diodes (LEDs) with an output current; and
controlling regulation of the output current based, at least in part, on the error signal, wherein the digital-to-analog converter is arranged to perform digital-to-analog conversion on a digital signal to provide the set signal such that the digital-to-analog conversion is offset based on the second trim value, and wherein performing the in-field end-of-line calibration includes:
providing the second stage trim signal based, at least in part, on a second stage end-of-line calibration value;
turning off a switch that is in series with the chain of LEDs;
causing a value that is associated with the digital input signal to be zero; and
iteratively determining a value of each bit of the second stage end-of-line calibration value based on the error signal; and
turning on the switch that is in series with the chain of LEDs.

* * * * *